United States Patent
Chang et al.

(10) Patent No.: US 12,019,974 B2
(45) Date of Patent: *Jun. 25, 2024

(54) GEOMETRIC MASK RULE CHECK WITH FAVORABLE AND UNFAVORABLE ZONES

(71) Applicant: Taiwan Semiconductor Manufacturing Co., Ltd., Hsinchu (TW)

(72) Inventors: Shih-Ming Chang, Hsinchu (TW); Shinn-Sheng Yu, Hsinchu (TW); Jue-Chin Yu, Taichung (TW); Ping-Chieh Wu, Zhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/334,551

(22) Filed: Jun. 14, 2023

(65) Prior Publication Data
US 2023/0325579 A1    Oct. 12, 2023

Related U.S. Application Data

(63) Continuation of application No. 17/386,737, filed on Jul. 28, 2021, now Pat. No. 11,714,951.
(Continued)

(51) Int. Cl.
*G06F 30/30*    (2020.01)
*G03F 1/36*    (2012.01)
(Continued)

(52) U.S. Cl.
CPC .............. *G06F 30/398* (2020.01); *G03F 1/36* (2013.01); *G03F 7/70433* (2013.01)

(58) Field of Classification Search
None
See application file for complete search history.

(56) References Cited

U.S. PATENT DOCUMENTS 5,663,893 A    9/1997 Wampler et al.
7,100,145 B2    8/2006 Shi
(Continued)

FOREIGN PATENT DOCUMENTS

| CN | 102193308 A | 9/2011 |
| CN | 108333865 A | 7/2018 |
| TW | 201839496 A | 11/2018 |

OTHER PUBLICATIONS

M.-C. Tsai et al., "A full chip MB-SRAF placement using SRAF guidance map," Proc. SPIE 7823, Photomask Technology 2010 (Sep. 24, 2010), 10 pages. (Year: 2010).*
(Continued)

*Primary Examiner* — Leigh M Garbowski
(74) *Attorney, Agent, or Firm* — Slater Matsil, LLP

(57) ABSTRACT

A method includes generating a diffraction map from a plurality of target patterns, generating a favorable zone and an unfavorable zone from the diffraction map, placing a plurality of sub-resolution patterns in the favorable zone, and performing a plurality of geometric operations on the plurality of sub-resolution patterns to generate modified sub-resolution patterns. The modified sub-resolution patterns extend into the favorable zone, and are away from the unfavorable zone.

20 Claims, 13 Drawing Sheets

Related U.S. Application Data

(60) Provisional application No. 63/188,196, filed on May 13, 2021.

(51) Int. Cl.
*G03F 7/00* (2006.01)
*G06F 30/398* (2020.01)

(56) References Cited

U.S. PATENT DOCUMENTS

| | | |
|---|---|---|
| 8,227,149 B2 | 7/2012 | Chun |
| 8,336,006 B2 | 12/2012 | Kodera |
| 8,443,312 B2 | 5/2013 | Tsai |
| 8,543,947 B2 | 9/2013 | Liu |
| 8,555,215 B2 | 10/2013 | Zou |
| 8,715,893 B2 | 5/2014 | Yang |
| 9,507,253 B2 | 11/2016 | Ishii |
| 9,754,088 B2 | 9/2017 | Ohzaki |
| 9,875,334 B2 | 1/2018 | Lutich |
| 10,198,546 B2 | 2/2019 | Kodama |
| 10,423,063 B2 | 9/2019 | Du et al. |
| 10,656,530 B2 | 5/2020 | Huang |
| 10,990,002 B2 | 4/2021 | Yamazoe et al. |
| 11,042,687 B2 | 6/2021 | Chen |
| 11,487,198 B2 | 11/2022 | Hsu et al. |
| 11,714,951 B2 * | 8/2023 | Chang ............... G03F 7/70433 |
| | | 716/51 |
| 11,755,814 B2 * | 9/2023 | Chen ..................... G06N 3/045 |
| | | 716/102 |
| 2004/0248016 A1 | 12/2004 | Lucas et al. |
| 2006/0200790 A1 | 9/2006 | Shang |
| 2017/0053058 A1 | 2/2017 | Yu et al. |
| 2017/0184979 A1 | 6/2017 | Hsu |
| 2018/0341740 A1 | 11/2018 | Cecil |
| 2019/0346768 A1 | 11/2019 | Huang et al. |

OTHER PUBLICATIONS

K. Kodera et al., "Novel Fine-tuned Model-based SRAF Generation Method Using Coherence Map," Proc. SPIE 7640, Optical Microlithography XXIII (Mar. 10, 2010), 10 pages. (Year: 2010).*

P. Gao et al., "SRAF generation based on SGM/CTM contour line," Proc. SPIE 11613, Optical Microlithography XXXIV, (Feb. 22, 2021), 7 pages. (Year: 2021).*

* cited by examiner

GEOMETRIC MASK RULE CHECK WITH FAVORABLE AND UNFAVORABLE ZONES

PRIORITY CLAIM AND CROSS-REFERENCE

This application is a continuation of U.S. patent application Ser. No. 17/386,737, filed Jul. 28, 2021, and entitled "Geometric Mask Rule Check With Favorable and Unfavorable Zones," which claims the benefit of the U.S. Provisional Application No. 63/188,196, filed on May 13, 2021, and entitled "Method for Performing Mask Rule Check with Favorable and Unfavorable Zone," which applications are hereby incorporated herein by reference.

BACKGROUND

In the formation of lithography masks, which are used for forming patterns for integrated circuits, First Order Diffraction Map (FODM) was used to generate seeds for scattering pattern bars and other Sub-Resolution Assistant Features (SRAFs). The seeds may be modified through relocation, sizing, merging, or separation in order to pass mask rule check (MRC) criterial. This ensures that the patterns meet the manufacturable requirement, such as minimum width, minimum space, minimum area, no acute angle, etc., of the mask-making processes and tools, and hence the lithography masks can be manufactured.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
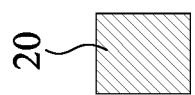
FIGS. 1 through 8 illustrate the intermediate stages in the generation of patterns for a lithography mask in accordance with some embodiments.
Figure 1:
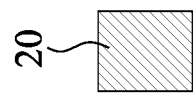

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A method of forming Sub-Resolution Assistance Features (SRAFs) (which are also referred to as scattering bars) is provided. The method includes laying out target patterns that are to be implemented on a wafer, generating a diffraction map from the target patterns, determining favorable zones and unfavorable zones from the diffraction map, generating initial patterns (seeds) in the favorable zones, and enlarging the initial patterns so that the enlarged patterns may pass the minimum width or/and the minimum area constrain of the mask rule checks. Since the enlargement may cause the degradation of optical performance, a pattern modification process is performed to modify the patterns, so that the resulting patterns no longer extend into the unfavorable zone. By keeping the patterns separated from the unfavorable zones, the modified patterns result in a better optical performance, and the target patterns may be implemented better on a photo resist. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1 through 8 illustrate the intermediate stages in the generation of patterns for a photo lithography mask in accordance with some embodiments of the present disclosure. The corresponding processes are also reflected schematically in the process flow 200 shown in FIG. 13.

Figure 13:
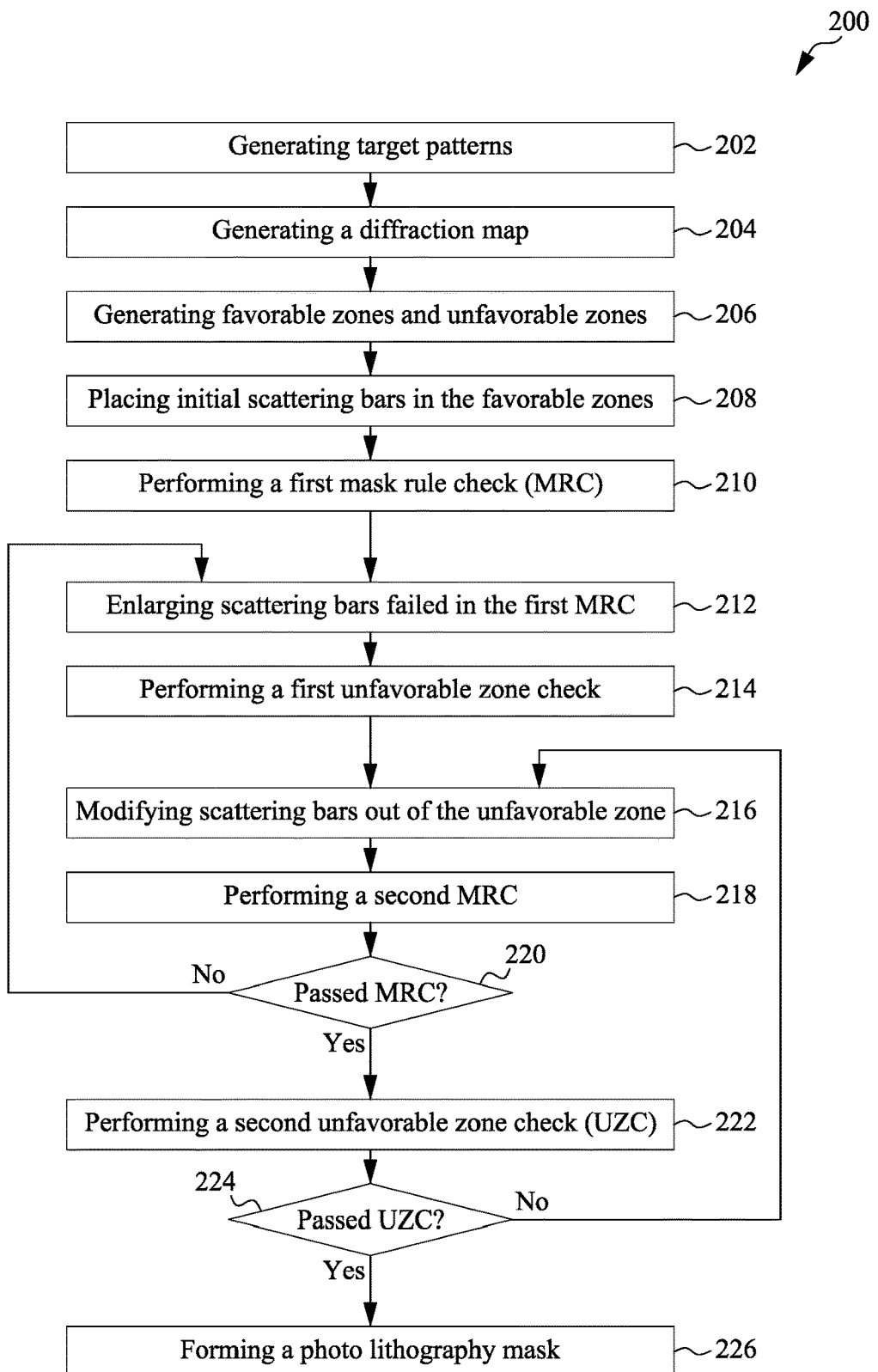
FIG. 13 illustrates a process flow for forming a lithography mask in accordance with some embodiments.

Referring to FIG. 1, target patterns 20 are generated/laid out. The respective process is illustrated as process 202 in the process flow 200 as shown in FIG. 13. Throughout the description, the term "target patterns" refers to the patterns of the target features that are to be implemented on integrated circuit components, which include and are not limited to, device wafers, interposer wafers, package substrates, reconstructed wafers, and the like. The target features may be any of the features that are to be formed, which include, and are not limited to, dielectric regions, semiconductor regions, metallic regions, or the like. Also, the target patterns may be formed on etching masks such as photo resists, which target patterns on the etching masks may then be transferred to the integrated circuit components.

Figure 9:
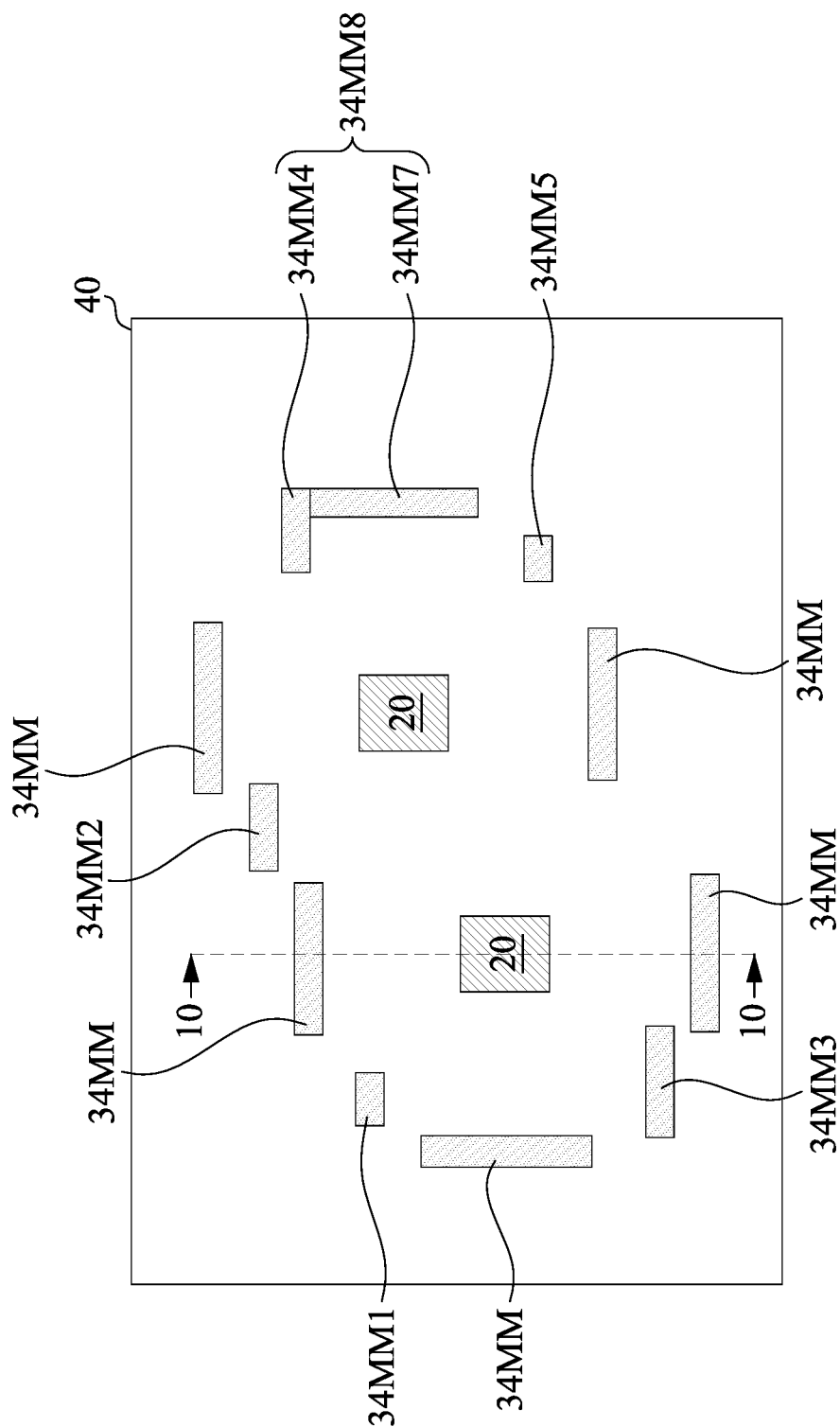
FIGS. 9 through 12 illustrate the cross-sectional views of intermediate stages in the formation of some patterns on integrated circuit component in accordance with some embodiments.
Figure 10:
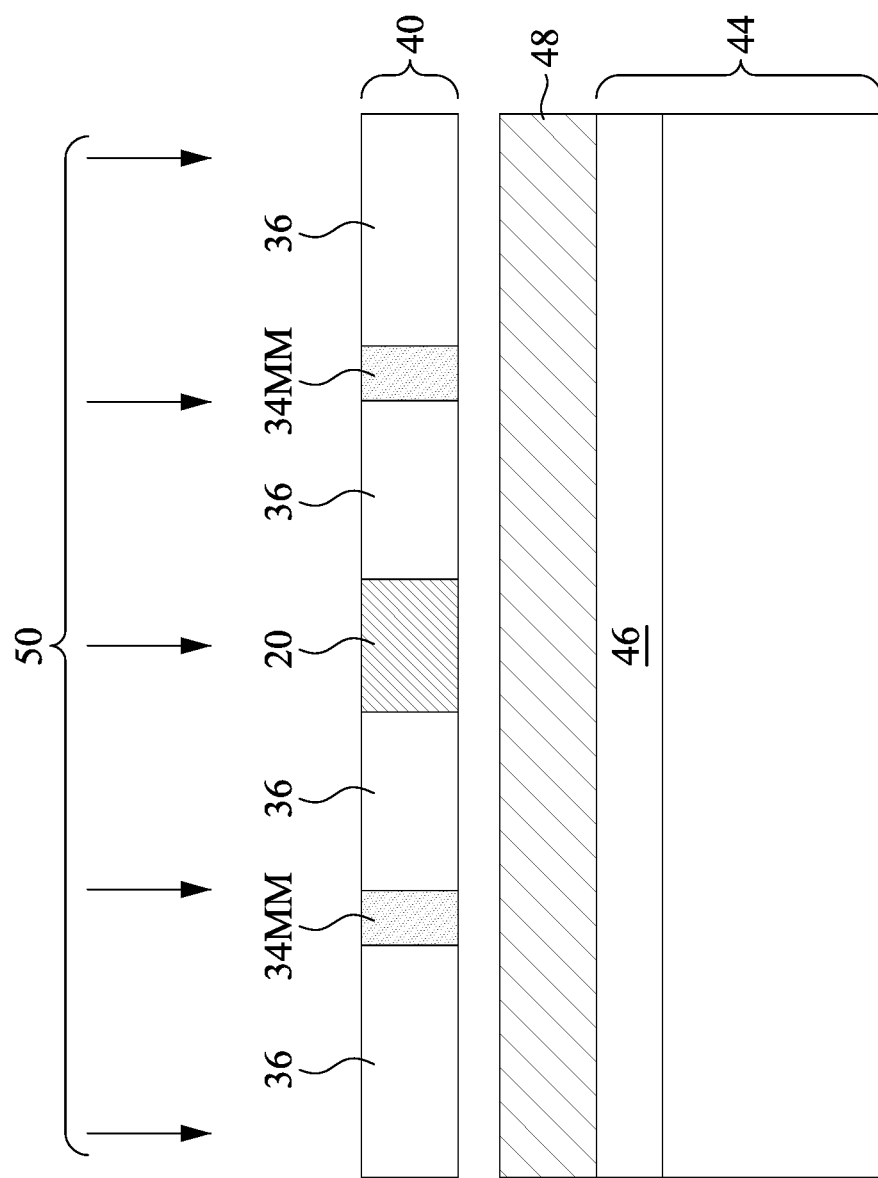

In order to implement the patterns on the integrated circuit components, the target patterns are to be formed on a photo lithography mask, such as the photo lithography mask 40 shown in FIGS. 9 and 10. The photo lithography mask includes transparent portions and opaque portions, with either the transparent portions or the opaque portions including the target patterns. The photo lithography mask is used in a lithography process, in which a light beam is projected on the photo lithography mask, so that an underlying photo sensitive material such as a photo resist is exposed. After the exposure and a subsequent development process, the target patterns are transferred into the photo sensitive material, which may then be used as an etching mask to form the target features on the integrated circuit components.

Due to optical effects, especially with the increasing down-scaling of the integrated circuits, the target features may not be implemented on the integrated circuit components accurately. For example, the shapes, the sizes, the spacings, etc., may be distorted. Sub-Resolution Assistant Features (SRAFs) may be used to help to more accurately implement the target features on the integrated circuit components. The SRAFs are formed on the photo lithography masks, and have sizes smaller than the resolution of the respective lithography tool and process. For example, when a 193 nm light beam is used for light exposure with Numerical Aperture (NA) equaling to 0.9 combined with proper illumination shape, the minimum resolution may have pitch equaling to 107 nm and width equaling to about 40 nm, and the features having at least one of lengths and widths smaller than about 20 nm are sub-resolution features. Although the sub-resolution assistant features are formed on the photo lithography masks, the resulting photo resist, after development, will not have these patterns. On the other hand, the target patterns will be formed on the photo resist with improved accuracy due to the help of the sub-resolution assistant features. Alternatively stated, although the sub-resolution assistant features are not on the photo resist, the patterns in the photo resist are closer to the patterns on the photo lithography mask due to the help of the sub-resolution assistant features.

Referring again to FIG. 1, two example target patterns 20 with square shapes are shown as an example. In actual circuits, however, the patterns may have any shape including, and not limited to, rectangles, hexagons, octagons, circles, ovals, or the like, or combination of these shapes. There may also be a much greater number of target patterns in a circuit. The concept of the embodiments, however, may be explained using simple target patterns.

Figure 2:
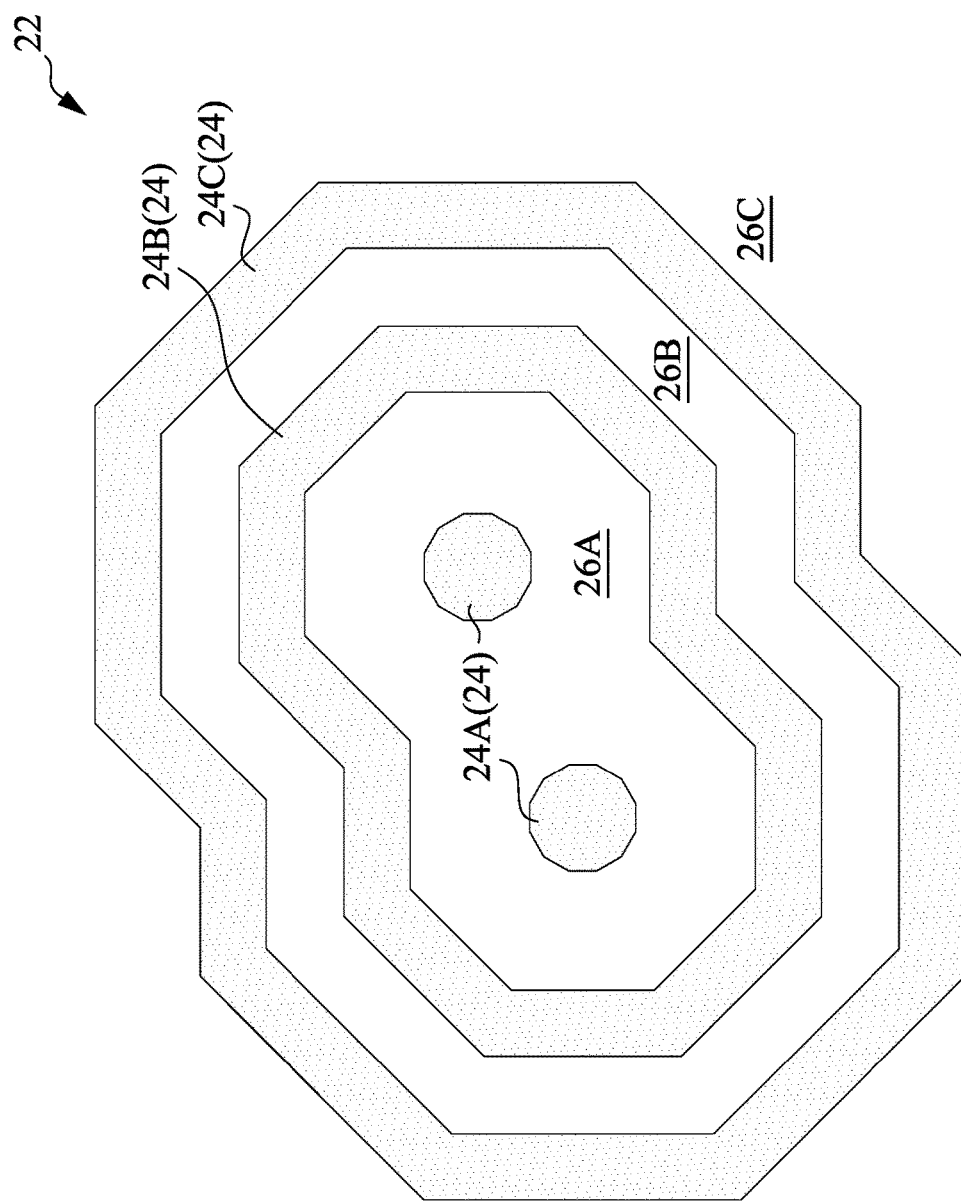

With target patterns 20 being provided, a diffraction map is generated according to the certain illumination shape which is used for lithography process. The respective process is illustrated as process 204 in the process flow 200 as shown in FIG. 13. A portion of an example diffraction map 22 is shown in FIG. 2. Diffraction map 22 includes the distinctive pattern of light and dark fringes, rings, etc., formed due to the diffraction from target pattern 20. For example, if holes are formed in an opaque plate, and the holes have the shapes and the sizes of the target patterns, when a light beam (with a certain wavelength) is projected on the opaque plate, diffraction map 22 may be formed on another plate behind the opaque plate.

In accordance with some embodiments of the present disclosure, diffraction map 22 is generated through simulation, for example, using a computer with a software configured to simulate the diffraction patterns. The simulation may have different accuracy level depending on the requirement. A more accurate simulation takes longer time to finish, and the resulting simulated refraction map is closer to the actual diffraction map (for example, the one obtained through holes on opaque plates). In accordance with some embodiments, the simulation may be a first-order simulation that with relatively lower accuracy, but takes shorter time to finish. The resulting first-order diffraction map still has some difference from the actual diffraction map, while it may still be accurate enough for implementing the embodiments of the present disclosure. The resulting diffraction map may thus be referred to as a first-order Diffraction Map (FODM) if a first-order simulation is performed. In accordance with other embodiments, the diffraction map may be generated with higher-order accuracy, and thus may be a second-order diffraction map, third-order diffraction map, or the like. In accordance with yet other embodiments, the diffraction map may be obtained using other methods, such as forming actual patterns on an opaque plate, and projecting a light beam on the opaque plate to obtain the diffraction map directly. All of these methods for generating the diffraction map are in the scope of the present disclosure.

As shown in FIG. 2, diffraction map 22 includes bright patterns 24, which include bright patterns 24A, 24B, 24C, and more, which are not shown. Bright patterns 24A are the patterns of target patterns 20 with distortion caused by optical effect, which is to be corrected by the embodiments of the present disclosure. Bright patterns 24B and 24C are the interference patterns. There may be more bright patterns outside bright patterns 24C. From inner bright patterns 24A to outer bright patterns 24B and 24C, the brightness decreases gradually. The patterns outside of bright pattern 24C may be too dim to distinguish, however. Furthermore, the outer bright patterns are closer to other nearby patterns (not shown), and may be affected by the bright patterns of the nearby pattern. Accordingly, in accordance with some embodiments, bright pattern 24A and 24B, and sometime bright patterns 24A, 24B and 24C, may be adopted by the embodiments of the present disclosure, while the rest of outer bright patterns are ignored in accordance with some embodiments of the present disclosure.

Diffraction map 22 further includes dark patterns 26, which include dark patterns 26A, 26B, 26C, etc., between bright patterns 24. It is appreciated that although FIG. 2 illustrates that there are clear boundaries between bright patterns 24 and dark patterns 26, FIG. 2 is schematic, and in the actual diffraction map, the middle portions of bright patterns 24 are brightest, and the middle portions of dark patterns 26 are darkest. The transition from bright patterns 24 to dark patterns 26 is gradual, and there are no clear boundaries in between.

Figure 3:
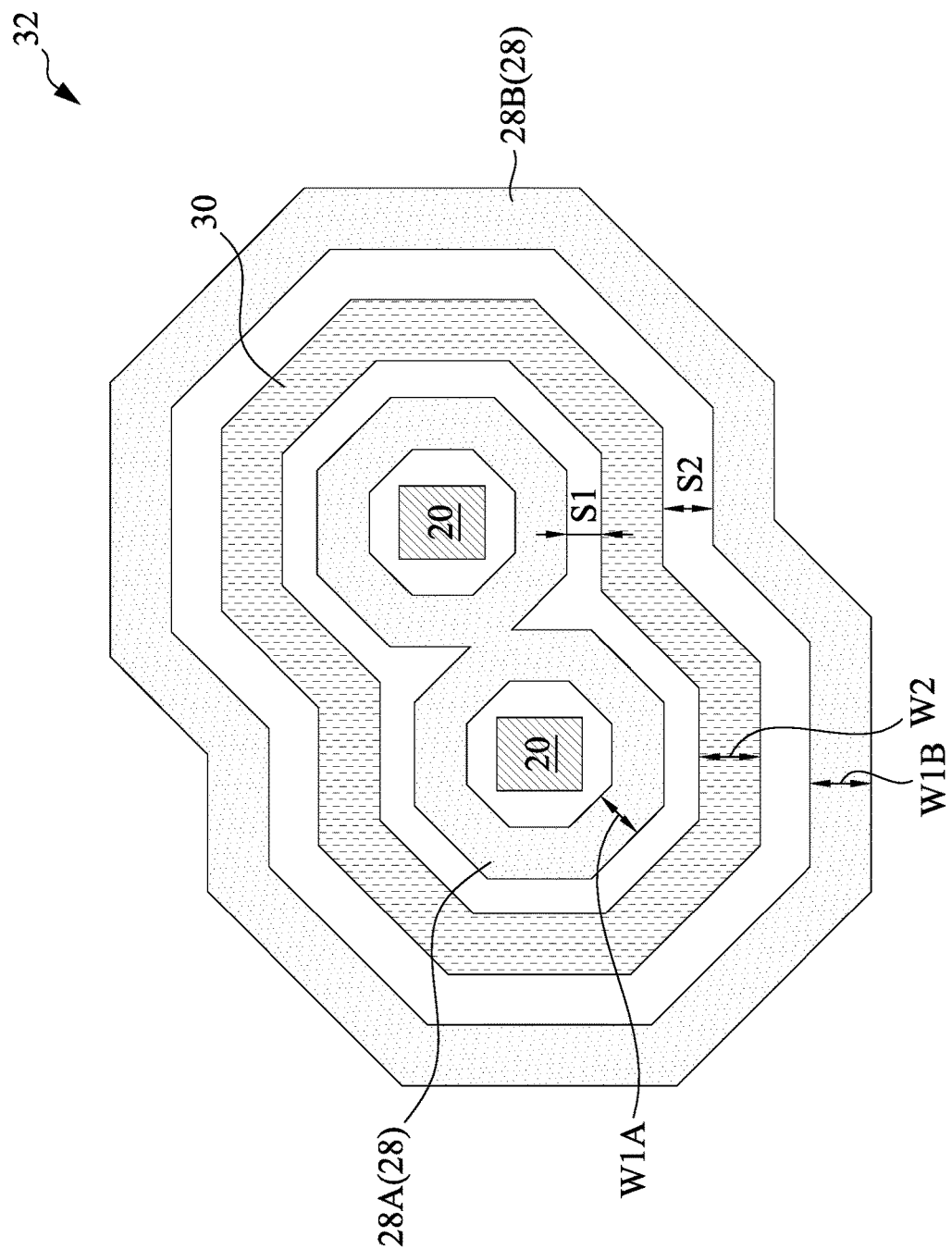

FIG. 3 illustrates the generation of zone map 32, which includes favorable zone(s) 30 and unfavorable zones 28 (including 28A and 28B) in accordance with some embodiments. The respective process is illustrated as process 206 in the process flow 200 as shown in FIG. 13. It is appreciated that although one favorable zone 30 and two unfavorable zones 28 are shown as an example, the total count of the favorable zone 30 may be any number equal to or greater than one, and the total count of the unfavorable zones 28 may be any number equal to or greater than one. Favorable zones 30 are generated based on bright patterns 24 (FIG. 2), and may include the parts of the bright patterns 24 whose brightness values exceeding a first pre-determined brightness value, which is discussed in subsequent paragraphs. Unfavorable zones 28 are generated based on dark patterns 26 (FIG. 2), and may include the parts of the dark patterns 26 whose brightness values lower than a second pre-determined brightness value, which is discussed in subsequent paragraphs.

Favorable zones 30 are the preferred zones in which the subsequently formed sub-threshold assistant features are to be placed, and the formation of sub-threshold assistant features in these regions help the formation of target features, and reduces undesirable optical effect. Unfavorable zones 28 are the zones in which the placement of the subsequently formed sub-threshold assistant features will worsen the undesirable optical effect. Accordingly, unfavorable zones 28 are also forbidden zones in which the formation of sub-threshold assistant features is forbidden.

In accordance with some embodiments, the determination/generation of favorable zones 30 and unfavorable zones 28 is based on absolute (threshold) brightness values. For example, two brightness values B1 and B2 may be predetermined, with brightness value B2 being greater than or equal to brightness value B1. When the brightness values at certain positions of diffraction map 22 are lower than brightness value B1, the corresponding positions belong to an unfavorable zone 28. When the brightness values at certain positions of diffraction map 22 are higher than brightness value B2, the corresponding positions belong to a favorable zone 30. In accordance with some embodiments, brightness value B1 is lower than brightness value B2. In the resulting zone map, favorable zones 30 are spaced apart from the neighboring unfavorable zones 28, as shown in FIG. 3. The difference (B2−B1) determines the spacings (such as spacings S1 and S2 in FIG. 3) between neighboring favorable zones 30 and unfavorable zones 28, and the brightness values B1 and B2 determine the widths (such as widths W1A, W1B, and W2 in FIG. 3) of unfavorable zones 28 and favorable zones 30, respectively. In accordance with alternative embodiments, values B1 and B2 are equal to each other. Accordingly, favorable zones 30 touch the corresponding neighboring unfavorable zones 28. Brightness value B1 is generally set not to be greater than brightness value B2 to avoid ambiguity in whether a certain position belongs to an unfavorable zone 28 or a favorable zone 30.

In accordance with alternative embodiments, the determination of favorable zones 30 and unfavorable zones 28 is based on relative brightness values. It is appreciated that the determination of relative brightness values may have many methods, which are in the scope of the present disclosure. The relative brightness values may be determined based on the highest brightness value of bright patterns, or based on both of the highest brightness value of a bright pattern(s) and the lowest brightness value of a dark pattern(s). In accordance with some example embodiments, the brightness value BBrig of the brightest point of bright patterns 24 is used as the criteria for generating favorable zones 30 and unfavorable zones 28. (Threshold) Relative brightness values F1 and F2 are also pre-determined, with both of relative brightness values F1 and F2 being between, and not including, 0 and 1. In accordance with some embodiments, when the brightness values at certain positions of diffraction map 22 are lower than F1*BBrig, the corresponding positions are in unfavorable zones 28. Conversely, when the brightness values at certain positions of diffraction map 22 are higher than F2*BBrig, the corresponding positions are in favorable zones 30. In accordance with some embodiments, value F1 is lower than brightness value F2. The difference (F2−F1) determines the spacings (such as spacings S1 and S2 in FIG. 3) between neighboring favorable zones 30 and unfavorable zones 28, and the relative brightness values F1 and F2 determine the widths (such as widths W1A, W1B, and W2 in FIG. 3) of unfavorable zones 28 and favorable zones 30, respectively. In accordance with alternative embodiments, relative brightness values F1 and F2 are equal to each other. Accordingly, favorable zones 30 touch the corresponding neighboring unfavorable zones 28. Relative brightness value F1 is generally set not to be greater than relative brightness value F2 to avoid ambiguity in whether a certain position belongs to an unfavorable zone 28 or a favorable zone 30.

Figure 4:
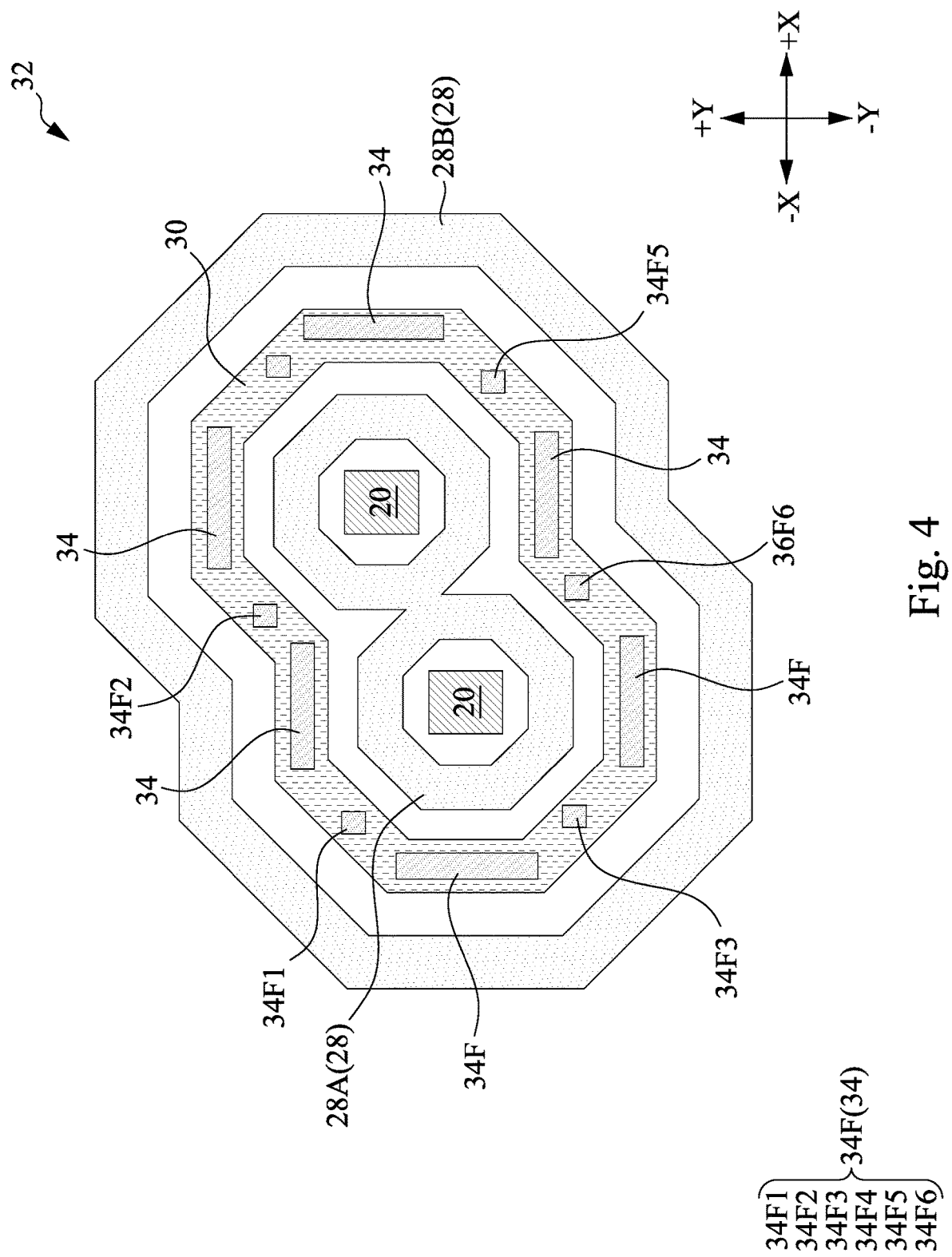

Referring to FIG. 4, target patterns 20 and initial Sub-Resolution Assistant Features (SRAFs) 34 are added to the zone map 32. The respective process is illustrated as process 208 in the process flow 200 as shown in FIG. 13. Initial SRAFs 34 are also patterns, which are intended to be formed on a photo lithography mask along with target patterns 20. In the subsequent discussion, initial SRAFs 34 are referred to as scattering bars since they are often formed as having bar shapes. Initial scattering bars 34 have lengths and/or widths smaller than the resolution (hence are sub-resolution features) of the lithography tool and process. Accordingly, scattering bars 34 (even after the subsequent modification) will not be transferred to the resulting integrated circuit components such as wafers, packages, package substrates, etc. As a comparison, target features 20 have lateral dimensions greater than the resolution, and hence their patterns will be transferred to the resulting integrated circuit components. Although the patterns of initial scattering bars 34 are not transferred, their existence on the photo lithography mask affect the optical effect in light-exposure processes, and the transferred patterns on the integrated circuit components are closer in shape and size to the target patterns 20 on the photo lithography mask.

In subsequent discussion, reference numeral 34 is used to represent both of the initial scattering bars and the scattering bars after modification processes. Letter(s) "M" and "MM" may also be added following reference numeral "34" to identify the stage of the modification.

The initial scattering bars 34 have beneficial effect on the transferring of target patterns 20 when initial scattering bars 34 are in bright patterns 24 (FIG. 2). Accordingly, initial scattering bars 34 are added into favorable zones 30 (FIG. 4), which are determined based on the brightness of the bright patterns 24. In accordance with some embodiments, initial scattering bars 34 are rectangular bars, and some of initial scattering bars 34 may be square bars. In accordance with alternative embodiments, initial scattering bars 34 may have any other shapes including, and not limited to, polygons (such as hexagons, octagons, or the like), circles, ovals, or the like. Initial scattering bars 34 may also have irregular shapes including the combinations of curves, straight lines, and/or the like. Also, an initial scattering bar 34 may be different from, or the same as, another initial scattering bar 34 in shapes, widths, lengths, etc.

In accordance with some embodiments, all of the initial scattering bars 34 are fully inside favorable zones 30. In accordance with alternative embodiments, some of initial scattering bars 34 may extend slightly out of favorable zones 30, and no scattering bar 34 extends into unfavorable zones 28. Scattering bar 34 may be placed suit to the shape and the extending direction of the respective part of favorable zones 30. Accordingly, some of initial scattering bars 34 may have their lengthwise directions in the X-direction, and some other scatterings bar 34 may have their lengthwise directions in the Y-direction.

Next, a first mask rule check is performed on the patterns that are to be formed into photo lithography masks. The respective process is illustrated as process 210 in the process flow 200 as shown in FIG. 13. The first mask rule check is geometric-based, and hence may be performed in a short period of time. The first mask rule check ensures that the manufacturing tool for forming photo lithography masks can form the scattering bars 34 and target patterns 20 on photo lithography masks. For example, the patterns that are too small, too close to each other, or having too small areas cannot be formed on photo lithography mask successfully. The mask rule check thus checks the patterns including the initial scattering bars 34 and target patterns 20 to ensure all mask rules are followed. Since the initial scattering bars 34 are formed as sub-resolution features, some of the initial scattering bars 34 may violate mask rules and thus fail to pass the mask rule check. The scattering bars 34 unable to pass mask rule check are referred to as mask-rule violating scattering bars hereinafter. FIG. 4 illustrate some example mask-rule violating scattering bars 34, which are marked using notations 34F. The mask-rule violating scattering bars 34F are also numbered by adding a digit following letter "F" in order to distinguish them from each other.

Figure 5:
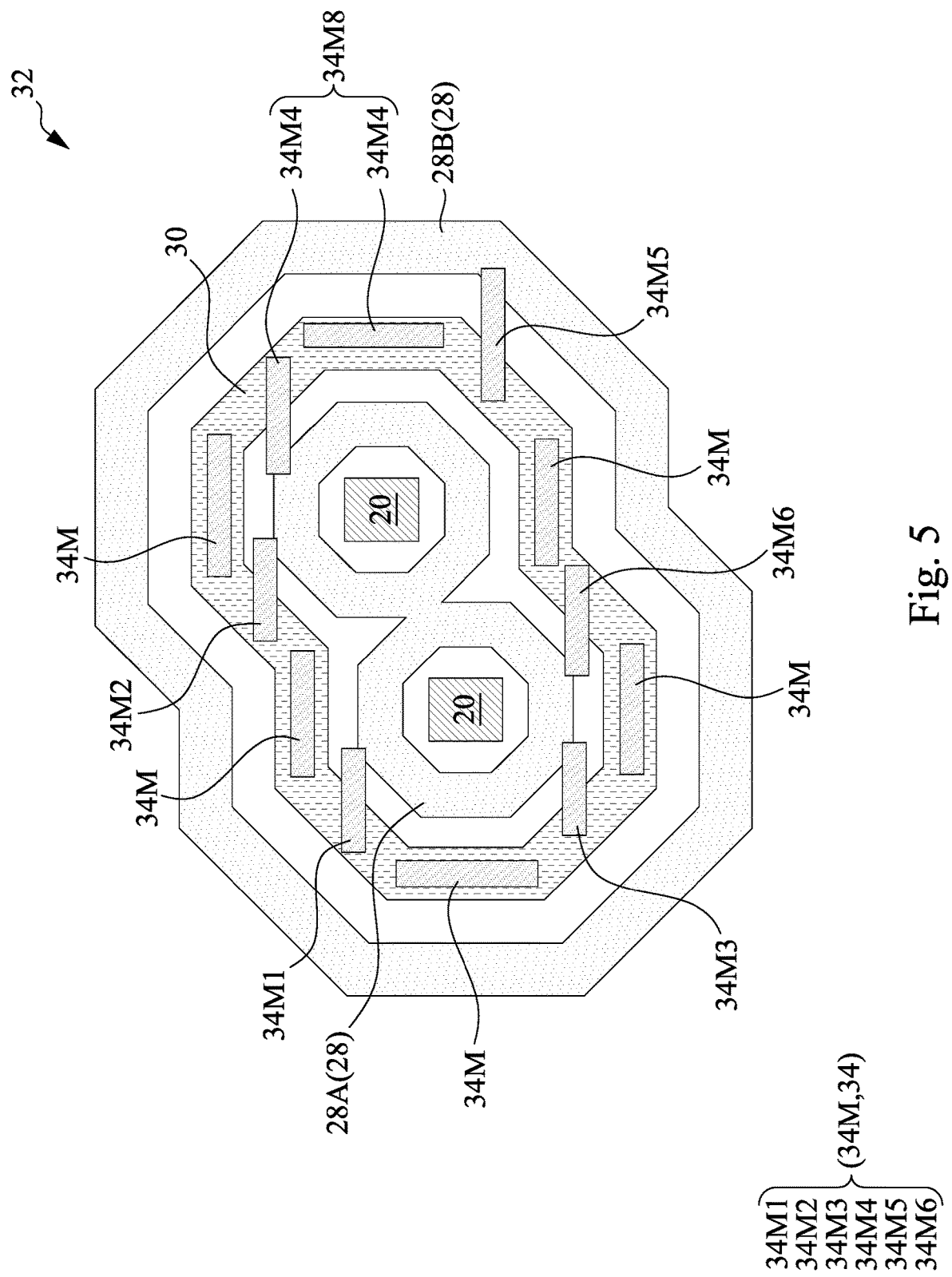
Figure 6:
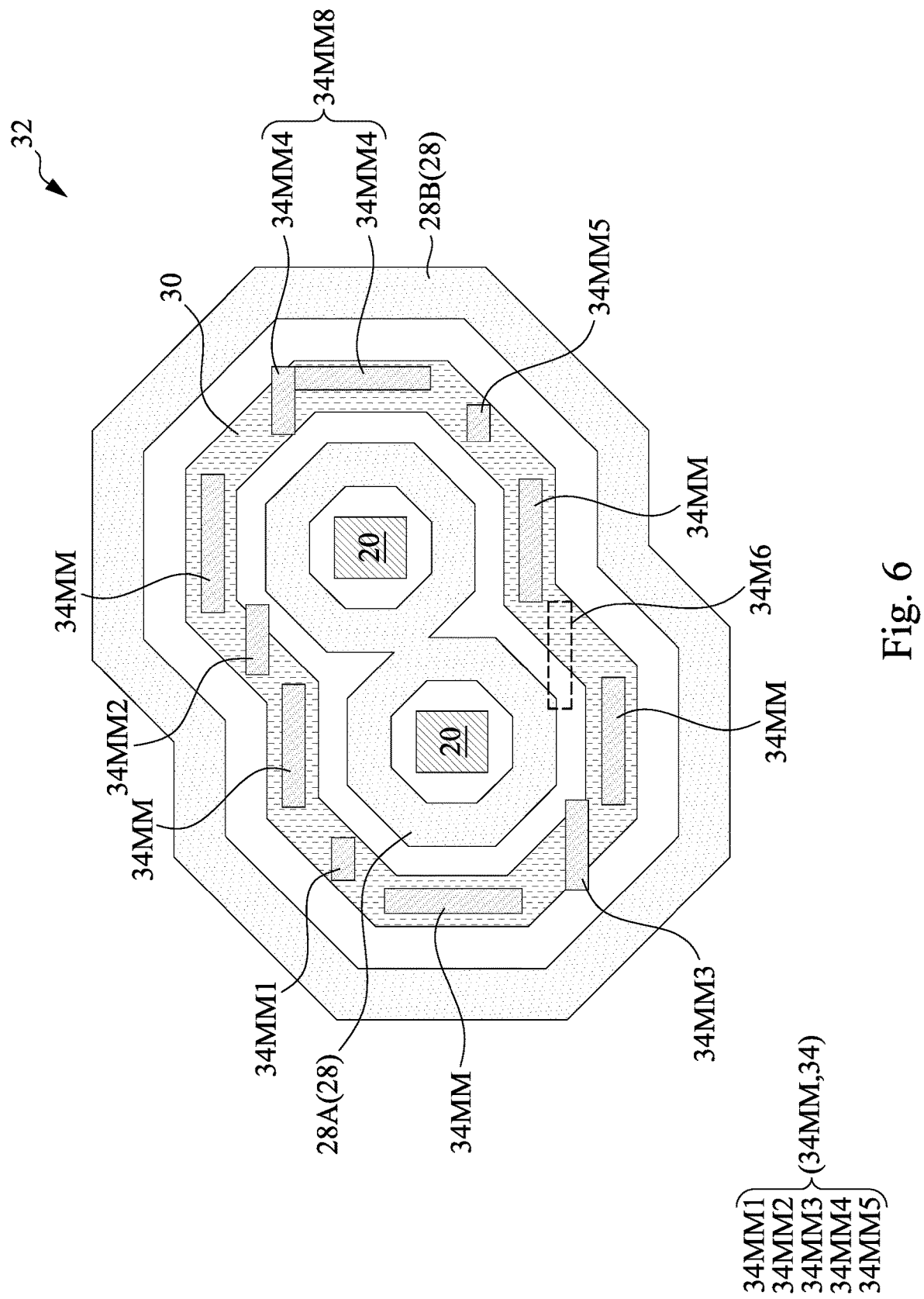

FIG. 5 illustrates a first scattering bar modification process (also referred to as a mask-rule compliant operation), wherein the mask-rule violating scattering bars 34F are enlarged to form modified scattering bars 34M (including 34M1 through 34M6), so that the modified bars 34M may pass mask rule check. The respective process is illustrated as process 212 in the process flow 200 as shown in FIG. 13. Although enlargement is used as an example of the mask-rule compliant operation, the mask-rule compliant operation may also include relocation and/or merging. All of the scattering bars 34 in FIG. 6 are identified using letter "M" to distinguish them from the initial scattering bars in FIG. 4, regardless of whether these scattering bars are modified or not from the scattering bars shown in FIG. 4. The first scattering bar modification process is geometric-based. The modification may include enlarging the initial scattering bars 34 either in the X-direction, Y-direction, or in both of the X-direction and the Y-direction. The modification may also include replacing a small scattering bar 34 with a larger scattering bars 34. FIG. 5 illustrates an example modification process in which the mask-rule violating scattering bars 34F are extended in the +X and −X directions, while they may also extend in the +Y direction and/or −Y direction. Furthermore, the mask-rule violating scattering bars 34F may also be relocated, for example, when the failure in mask rule check is caused by the too-small spacing between the mask-rule violating scattering bars 34F. The scattering bar modification process may be performed through a software executed in a computer.

The scattering bar modification process is performed for the purpose of passing the mask rule check, while the effect of the scattering bar modification process on the optical performance is not considered. The effect of the modified scattering bars 34M on the optical performance may be determined through simulation. The simulation, however, takes long time to finish, especially when large integrated circuit components having complicated patterns are simulated. In accordance with some embodiments of the present disclosure, unfavorable zones 28 are used to at least limit the adverse effect on the optical performance caused by the scattering bar modification process, or improve the optical performance significantly.

FIG. 5 illustrates some examples of the modified scattering bars 34M. For example, the modified scattering bars 34M1, 34M2, 34M3, 34M4, and 34M6 extend into (and overlap) unfavorable zone 28A, and the modified scattering bar 34M5 extends into (and overlap) unfavorable zone 28B. There may also be some modified scattering bars 34M that do not extend into unfavorable zones 28A and 28B after the first scattering bar modification process.

Since unfavorable zones 28 are determined as including the dark patterns 26 in the diffraction map, when the modified scattering bars 34M extend into unfavorable zones 28, the optical performance will be adversely affected. Accordingly, an unfavorable zone check process is performed to identify the scattering bars 34M that extend into the unfavorable zones 28. The respective process is illustrated as process 214 in the process flow 200 as shown in FIG. 13. The identified scattering bars 34M that extend into the unfavorable zones 28 are referred to as unfavorable patterns or unfavorable scattering bars.

When one or more of the modified scattering bars 34M is identified as unfavorable scattering bars, a second scattering bar modification process is performed to modify unfavorable scattering bars again, and to keep the resulting scattering bars 34 out of the unfavorable zones 28. The respective process is illustrated as process 216 in the process flow 200 as shown in FIG. 13.

It is appreciated that the unfavorable zone check process 214 is a geometric checking process, which may be performed fast. As a comparison, if the optical performance of the modified scattering bars 34M are to be determined through simulation, the simulation will take long time. Accordingly, the optical performance determining process in accordance with the embodiments of the present disclosure is much more efficient.

The second scattering bar modification process may include a plurality of geometric-based operations including, and not limited to, shrinking, relocating, merging, removing, and the like, and/or combinations thereof. The resulting modified scattering bars are referred to as 34MM, which includes 34MM1 through 34MM5. All of the scattering bars in FIG. 6 are identified as including "MM" to distinguish them from the scattering bars in FIG. 5, regardless of these scattering bars are modified or not from the scattering bars shown in FIG. 5.

In accordance with some embodiments, the modified scattering bars 34M1 (FIG. 5) extends into unfavorable zone 28A, and is shrunk in a direction away from unfavorable zone 28A in the second scattering bar modification process. The resulting modified scattering bars 34MM1 (FIG. 6) no long extends into unfavorable zone 28A. The modified scattering bars 34M2 and 34M3 (FIG. 5) also extend into unfavorable zone 28A, and are shrunk in directions away from unfavorable zone 28A. The resulting modified scattering bars 34MM2 and 34MM3 (FIG. 6) no long extends into unfavorable zone 28A. The modified scattering bars 34M4 (FIG. 5) extends into unfavorable zone 28A, and is merged with scattering bar 34M7 (which may be mask-rule violating or mask-rule compliant) to form a new modified scattering bar 34MM8 (FIG. 6). In accordance with some embodiments, the merging may be achieved by resizing (enlarging or shrinking) and/or relocating one or both of the merged scattering bars 34M4 and 34M7. The merging causes the merged size to be larger, and hence the merged pattern may pass the minimum area constrain of the mask rule check. The modified scattering bars 34M5 (FIG. 5) extends into unfavorable zone 28B, and is shrunk in a direction away from unfavorable zone 28B. The resulting modified scattering bars 34MM5 (FIG. 6) no long extends into unfavorable zone 28B. The modified scattering bars 34M6 (FIG. 5) extends into unfavorable zone 28A, and is removed. FIG. 6 illustrates where the removed scattering bar 34M6 was using a dashed bar.

The second scattering bar modification process may (or may not) be performed with the mask rules taken into account in accordance with some embodiments. For example, the shrinking may be performed so that the resulting shrunk scattering bars 34M1 and 34M2 are still great enough to pass the minimum width or/and the minimum area constrain of the mask rule check. In accordance with some embodiment, the modification is based on certain pre-determined rules, for example, shrinking to a certain percentage (such as between about 70 percent and about 90 percent) of the original length. The resulting modified scattering bars 34MM may or may not pass mask rule check in accordance with these embodiments, and further mask rule check, unfavorable zone check, and the corresponding modification processes may be needed.

As the result of the second scattering bar modification process, some or all of the modified scattering bars 34MM1 may be fully inside favorable zones 30. In accordance with alternative embodiments, some of the modified scattering bars 34MM are fully inside favorable zones 30, while some other scattering bars 34MM (such as 34MM2 and 34MM3) are partially inside favorable zones 30, and partially out of favorable zones 30. These scattering bars 34MM, however, are outside of unfavorable zones 28.

Referring to the process flow 200 as shown in FIG. 13, a rework process may be performed. The rework process may include processes 218 through 224, and may also include processes 212 and 214 if processes loop back to processes 212 and 214. The rework process is discussed below.

In accordance with some embodiments, after the second scattering bar modification process 216, a second mask rule check process may be performed to ensure that the twice-modified scattering bars don't violate mask rules. The respective process is illustrated as process 218 in the process flow 200 as shown in FIG. 13. For example, the shrinking of scattering bars may cause scattering bars 34MM to be too small again. If the second mask rule check is passed with no scattering bar 34MM failing, as shown in process 220 in process flow 200, the process flow may go to process 222 in FIG. 13. Otherwise, the process loops back to process 212 in the process flow 200 as shown in FIG. 13, and another scattering bar enlargement process 212, the subsequent unfavorable zone check process 214, scattering bar modification process 216, etc., are performed again.

In accordance with some embodiments, after passing the second scattering bar modification process, a second unfavorable zone check process 222 may be performed to ensure that the twice-modified scattering bars do not fall into unfavorable zones again. The respective process is illustrated as process 222 in the process flow 200 as shown in FIG. 13. For example, when relocating a scattering bar away from unfavorable zone 28A, the scattering bar may extend into unfavorable zone 28B. The scattering bars that fall into unfavorable zones again will be marked and modified again. As shown in process 224, if all scattering bars 34 pass the second unfavorable zone check process 222, the patterns generated in preceding processes may be used to form a photo lithography mask. Otherwise, if one or more scattering bars 34 fail to pass the second unfavorable zone check process 222, the process loops back to process 216 in the process flow 200 as shown in FIG. 13, and another scattering bar modification process and the subsequent processes are performed.

Figure 7:
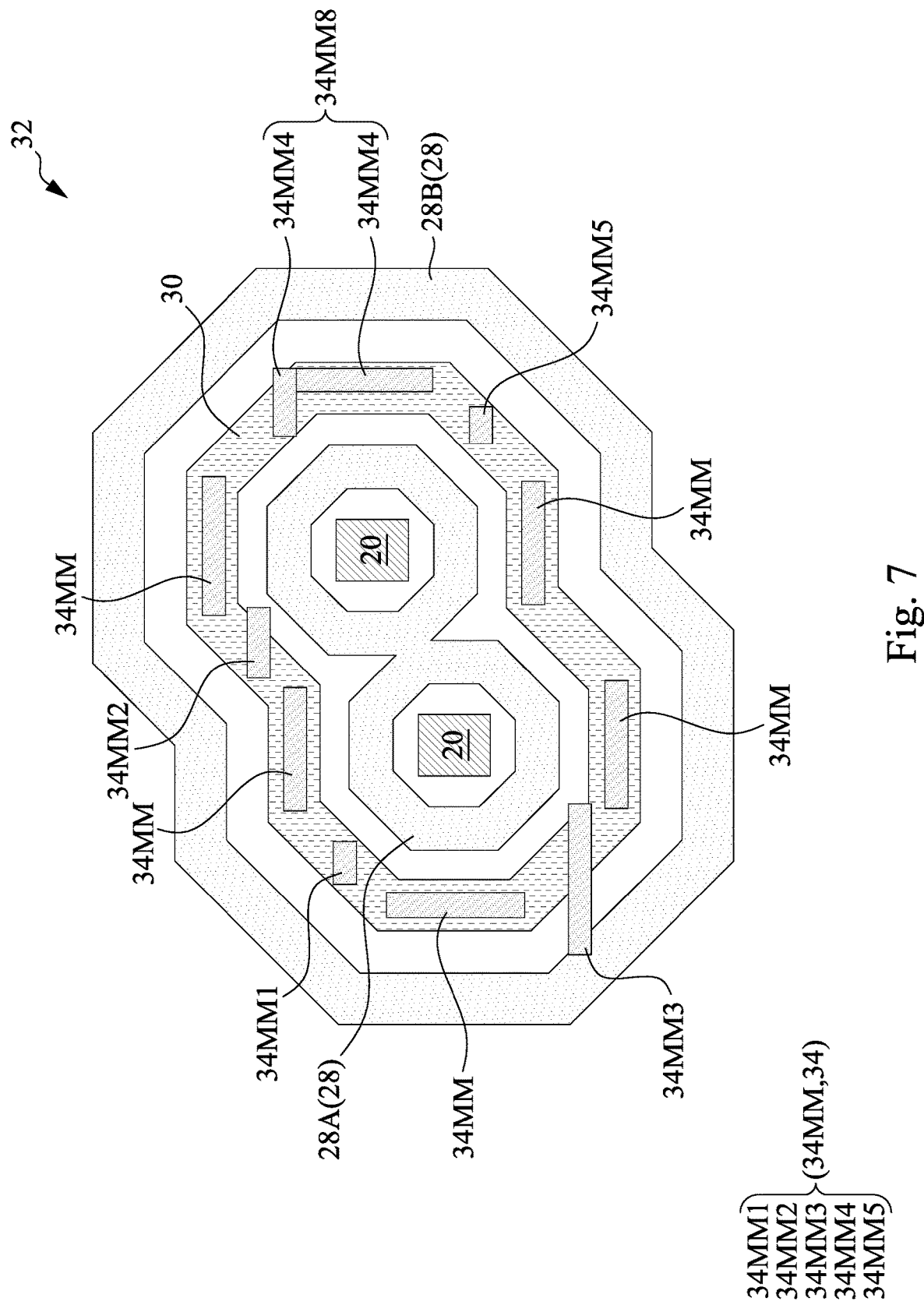
Figure 8:
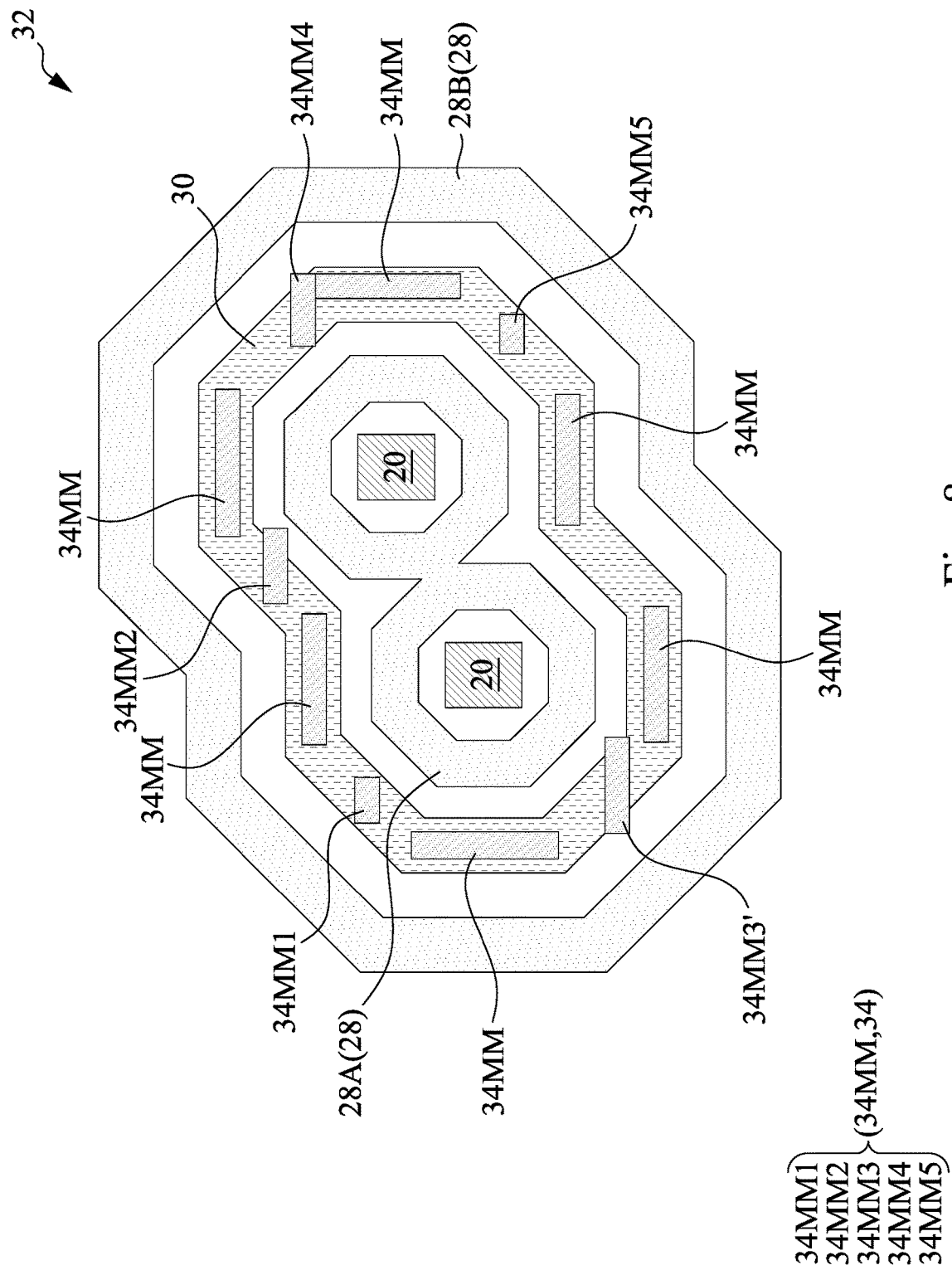

FIGS. 7 and 8 illustrate the scattering bars in a rework process as an example. In FIG. 7, the modified scattering bar 34MM3 extends into unfavorable zone 28B. Accordingly, another modification process is performed to shrink scattering bar 34MM3, and to generate scattering bar 34MM3' as shown in FIG. 8.

It is appreciated that if the previous processes are improperly performed, rework processes may be performed endlessly. For example, relocating a scattering bar away from unfavorable zone 28A causes it to extend into unfavorable zone 28B, and the relocating in the rework may cause it to extend back into unfavorable zone 28B again. To prevent this from happening, some considerations may be taken into the scattering bar modification process in the rework. For example, assuming a previously modified scattering bar still fails in the unfavorable zone check process 224, in the resulting re-execution of scattering bar modification process 216, a new modification operation different from the previous modification operation will be performed. For example, if the previous modification operation was a shrinking operation, the newly performed modification operation may be relocation, merging, or the like. Alternatively, the same operation may be performed but with different parameters. For example, shrinking rate may be changed from 20% to 15%, or shrinking value is changed from 2.0 nm to 1.5 nm. This may prevent the cyclic operation. In accordance with some embodiments, a pre-determined number of reworks (such as 1, 2, or 3, or more) may be allowed to be performed, with the operations in the reworks different from the previous operations. If there are still scattering bar(s) 34 fail to pass the unfavorable zone check process and/or mask rule check process after the pre-determined number is reached, these scattering bars will be removed to end the loop, or be marked and reported as an error for further handling.

In accordance with some embodiments, if one or more previously modified scattering bar still fail in mask rule check process 220 or the unfavorable zone check process 224, the failed scattering bars are removed to prevent the further rework, and to prevent cyclic reworks, without further try, or may be marked and reported as an error for further handling.

In above-discussed processes, a two-step scattering bar modification process is performed, which includes enlarging scattering bars 34, and then performing modification processes, so that the resulting modified scattering bars 34 are kept out of the unfavorable zones. In accordance with alternative embodiments, a one-step scattering bar modification process is performed, wherein in the enlargement of the mask-rule violating scattering bars, the unfavorable zones 28 are considered, and the enlargement is toward selected directions away from the nearest unfavorable zones 28. The scale of the enlargement in the selected direction is also controlled, so that the resulting enlarged scattering bars will not extend into unfavorable zones 28. The subsequent mask rule check may be performed or may be skipped. The subsequent unfavorable zone check is no longer needed.

In accordance with some embodiments, as discussed referring to FIGS. 1 through 8, a pattern-generation process includes generating a diffraction map including both of unfavorable zones 28A and 28B, and rework processes are performed. It is appreciated that unfavorable zone 28A has a greater effect on the optical performance than unfavorable zone 28B. This means a scattering bar has smaller adverse effect on optical performance extending into unfavorable zone 28B than extending into unfavorable zone 28A. Accordingly, in accordance with some embodiments, to improve the efficiency in the generation of patterns, unfavorable zone 28A is generated, while unfavorable zone 28B is not generated to compromise efficiency and accuracy. In accordance with these embodiments, rework may be, or may not be performed. In accordance with alternative embodiments, both of unfavorable zones 28A and 28B are generated, and no rework process is performed. Alternatively, the scattering bar will be marked and reported as an error for further handling after a certain number (such as 5) of times of iteration of rework.

The target patterns 20 and the scattering patterns 34MM (FIG. 6 or FIG. 8) are then used to form a photo lithography mask 40 as shown in FIGS. 9 and 10. It is appreciated that a photo lithography mask different from what is shown may be used. For example, an extreme Ultraviolet (EUV) mask may be adopted. The respective process is illustrated as process 226 in the process flow 200 as shown in FIG. 13.

FIG. 9 illustrates a top view of a portion of photo lithography mask 40, in which scattering bars 34MM (which are also scattering patterns 34) and target patterns 20 are formed. The favorable zones 30 and unfavorable zones were used to assist the generation of scattering bars 34, and are not formed in photo lithography mask 40.

Figure 11:
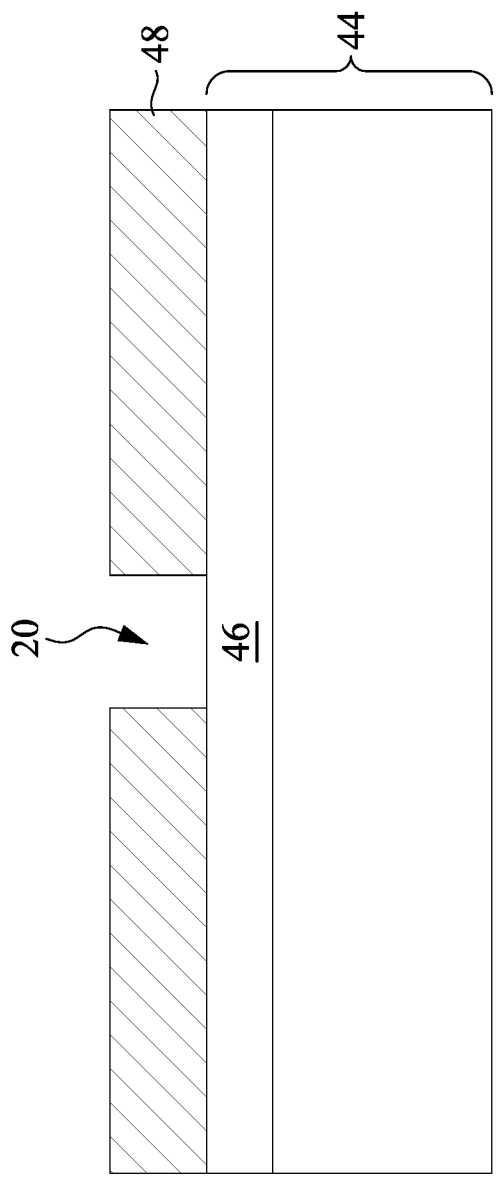
Figure 12:
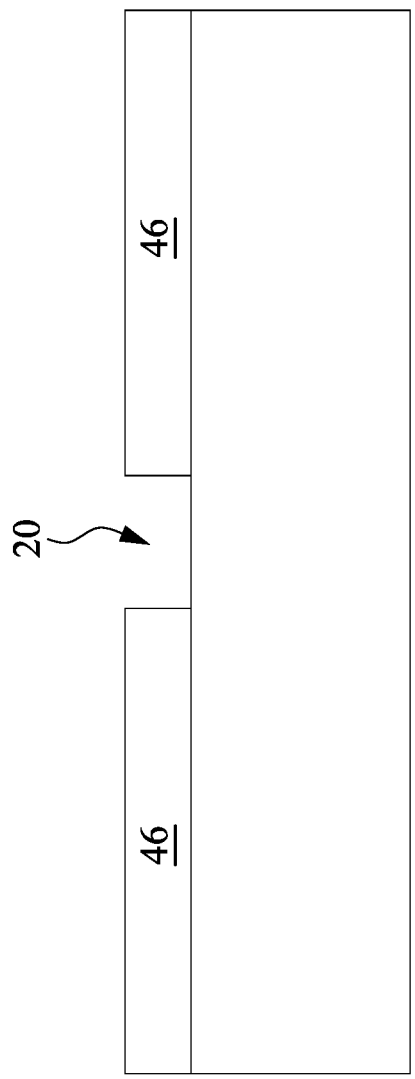

FIGS. 10 through 12 illustrate the cross-sectional view of intermediate stages in the transferring of the patterns in photo lithography mask 40 into integrated circuit component 44 in accordance with some embodiments. Referring to FIG. 10, lithograph mask 40 includes opaque portions and transparent portions. In accordance with some embodiments, the target patterns 20 and scattering bars 34 are formed as the opaque portions, which are between transparent portions 36, as shown in FIG. 10. In accordance with alternative embodiments, target patterns 20 and scattering bars 34 may be formed as transparent portions of the lithograph mask, with opaque portions separating them from each other. FIG. 10 illustrates the reference cross-section 10-10 in FIG. 9.

Integrated circuit component 44 is placed underneath photo lithography mask 40. Integrated circuit component 44 may be a device wafer, an interposer wafer, a package substrate strip, a reconstructed wafer, or the like. Integrated circuit component 44 includes target layer 46, which may be a dielectric layer, a semiconductor layer, a conductive layer (such as a metal layer), or the like. Photo resist 48 is applied over target layer 46. Light 50 is projected on lithograph mask 40, so that photo resist 48 is exposed.

After the light-exposure of photo resist 48, photo lithography mask 40 is moved away. Photo resist 48 is baked and developed, and some portions are removed. The resulting photo resist 48 includes the patterns of target patterns 20, but not the patterns of scattering patterns 34, as shown in FIG. 11. In a subsequent process, photo resist 48 is used to etch the underlying target layer 46. The resulting etched target layer 46 again includes the patterns 20 of target patterns 20, but not the patterns of scattering patterns 34. Photo resist 48 is then removed, and the resulting structure is shown in FIG. 12. In the above-discussed processes, scattering patterns 34 result in more accurate transferring of target patterns 20 into target layer 46, although scattering patterns 34 are not formed in target layer 46.

In above-discussed processes, the processes shown in FIGS. 1 through 8 may be performed using a computer with software (programing codes) and hardware. The software includes the tools for performing the tasks including, and not limited to, generating (laying out) target patterns, simulating diffraction maps, generating favorable zones and unfavorable zones, generating initial scattering patterns, performing mask rule checks, enlarging scattering patterns, performing unfavorable zone checks, modifying the scattering zones, and the like. The program codes of the software and the results such as the diffraction map, the favorable zones and unfavorable zones, the target patterns and the scattering patterns may be embodied on a non-transitory storage media, such as a hard drive, a disc, or the like, and may be shipped for manufacturing photo lithography masks.

In above-illustrated embodiments, the advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

The embodiments of the present disclosure have some advantageous features. By generating favorable and unfavorable zones, scattering bars are generated, and are separated from unfavorable zones. The optical effect is thus optimized. The optimization of the optical effect is through geometric checking of the scattering bars to decide whether they extend into the unfavorable zones, and hence is fast. This saves the time that is otherwise spent on performing time-consuming simulations to determine the optical effect of the scattering bars.

In accordance with some embodiments of the present disclosure, a method comprises generating a diffraction map from a target pattern, wherein the diffraction map comprises a bright pattern and a dark pattern; generating a favorable zone and an unfavorable zone from the bright pattern and the dark pattern; placing a first plurality of sub-resolution patterns in the favorable zone; performing a mask-rule compliant operation (which may be an enlargement operation, a relocation operation, or a merging operation) on the first plurality of sub-resolution patterns to generate a second plurality of sub-resolution patterns, wherein a first group of sub-resolution patterns in the first plurality of sub-resolution patterns are enlarged; performing an unfavorable zone check process to find unfavorable patterns, wherein the unfavorable patterns are enlarged first group of sub-resolution patterns that extend into the unfavorable zone; and performing a geometric operation on the second plurality of sub-resolution patterns to generate a third plurality of sub-resolution patterns, wherein unfavorable patterns are separated from the unfavorable zone. In an embodiment, the method further comprises a mask rule check process to find the first group of sub-resolution patterns from the first plurality of sub-resolution patterns, wherein the first group of sub-resolution patterns are mask-rule violating patterns. In an embodiment, the first plurality of sub-resolution patterns further comprise a second group of sub-resolution patterns that are mask-rule compliant, and in the enlargement operation, the second group of sub-resolution patterns are un-modified. In an embodiment, the geometric operation comprises shrinking one of the unfavorable patterns. In an embodiment, the geometric operation comprises relocating one of the unfavorable patterns. In an embodiment, the geometric operation comprises removing one of the unfavorable patterns. In an embodiment, the geometric operation comprises merging one of the unfavorable patterns with another one of the plurality of sub-resolution patterns. In an embodiment, the method further comprises manufacturing a photo lithography mask, wherein the target pattern and the third plurality of sub-resolution patterns are formed in the photo lithography mask; and using the photo lithography mask to form an integrated circuit component, wherein the target pattern is implemented on the integrated circuit component, and the third plurality of sub-resolution patterns are not implemented on the integrated circuit component. In an embodiment, the method further comprises performing a mask rule check process on the third plurality of sub-resolution patterns. In an embodiment, the method further comprises enlarging additional mask-rule violating scattering bars in the third plurality of sub-resolution patterns to generate a fourth plurality of sub-resolution patterns. In an embodiment, the method further comprises performing an additional unfavorable zone check on the fourth plurality of sub-resolution patterns.

In accordance with some embodiments of the present disclosure, a method comprises generating a diffraction map from a plurality of target patterns; generating a favorable zone and an unfavorable zone from the diffraction map;

placing a plurality of sub-resolution patterns in the favorable zone; and performing a plurality of geometric operations on the plurality of sub-resolution patterns to generate modified sub-resolution patterns, wherein the modified sub-resolution patterns extend into the favorable zone, and are away from the unfavorable zone. In an embodiment, the diffraction map comprises a bright region and a dark region, and the favorable zone comprises a part of the bright region, and the unfavorable zone comprises a part of the dark region. In an embodiment, the method further comprises determining a first threshold brightness value and a second threshold brightness value equal to or higher than the first threshold brightness value, wherein regions in the diffraction map with brightness values lower than the first threshold brightness value are in unfavorable zones, and wherein regions in the diffraction map with brightness values higher than the second threshold brightness value are in favorable zones. In an embodiment, the plurality of geometric operations comprise an enlargement operation to enlarge some of the plurality of sub-resolution patterns and to generate enlarged patterns; and an additional geometric operation to separate the enlarged patterns from the unfavorable zone. In an embodiment, the method further comprises performing a mask rule check process to find mask-rule violating scattering bars in the plurality of sub-resolution patterns that have gone through some of the plurality of geometric operations. In an embodiment, the method further comprises an unfavorable zone check process to find unfavorable patterns in the plurality of sub-resolution patterns, wherein the unfavorable patterns extend into the unfavorable zone.

In accordance with some embodiments of the present disclosure, a method comprises generating an unfavorable zone and a scattering pattern; determining whether the scattering pattern is overlapped with the unfavorable zone; modifying the scattering pattern to generate a modified scattering pattern, wherein the modified scattering pattern is separated from the unfavorable zone; forming a photo lithography mask comprising the modified scattering pattern; and using the photo lithography mask to perform a light-exposure process on a photo resist. In an embodiment, the method further comprises generating a diffraction map from a target pattern, wherein the target pattern is also in the photo lithography mask; and determining the unfavorable zone and a favorable zone from the diffraction map, wherein the scattering pattern is placed in the favorable zone. In an embodiment, the modifying the scattering pattern comprises enlarging the scattering pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
generating a diffraction map;
generating a first plurality of sub-resolution patterns in the diffraction map;
selecting a first sub-resolution pattern and a second sub-resolution pattern from the first plurality of sub-resolution patterns, wherein the selecting is based on locations of the first plurality of sub-resolution patterns in the diffraction map; and
performing modification operation to modify the first plurality of sub-resolution patterns collectively as a second plurality of sub-resolution patterns, wherein the first sub-resolution pattern is modified to generate a third sub-resolution pattern, and wherein the second sub-resolution pattern remains to be un-modified.

2. The method of claim 1 further comprising, before the first plurality of sub-resolution patterns is generated:
placing a third plurality of sub-resolution patterns in the diffraction map;
performing a mask rule check process on the third plurality of sub-resolution patterns; and
modifying the third plurality of sub-resolution patterns based on results of the mask rule check process to generate the first plurality of sub-resolution patterns.

3. The method of claim 2, wherein a position, a size, and a shape of the second sub-resolution pattern remain same as before the modification operation.

4. The method of claim 1, wherein the modification operation comprises an operation selected from the group consisting of enlargement, relocation, and combinations thereof.

5. The method of claim 1, wherein the modification operation comprises shrinking, merging, or removing processes.

6. The method of claim 5, wherein the modification operation further comprises removing an additional sub-resolution pattern in the first plurality of sub-resolution patterns.

7. The method of claim 5, wherein the modification operation comprises merging two of the first plurality of sub-resolution patterns.

8. The method of claim 1, wherein the diffraction map comprises a bright pattern and a dark pattern, and the method further comprises generating a favorable zone and an unfavorable zone from the bright pattern and the dark pattern, respectively.

9. The method of claim 8, wherein the selecting the first sub-resolution pattern comprises finding the first plurality of sub-resolution patterns that extend into the unfavorable zone.

10. The method of claim 1 further comprising:
manufacturing a photo lithography mask, wherein the second plurality of sub-resolution patterns are formed in the photo lithography mask; and
using the photo lithography mask to form an integrated circuit component.

11. The method of claim 10, wherein the second plurality of sub-resolution patterns that are in the photo lithography mask are not implemented on the integrated circuit component.

12. A method comprising:
generating a diffraction map from a plurality of target patterns, wherein the diffraction map comprises a favorable zone and an unfavorable zone encircling the favorable zone;
placing a first plurality of sub-resolution patterns in the favorable zone;
modifying the first plurality of sub-resolution patterns to generate a second plurality of sub-resolution patterns;
selecting a first sub-resolution pattern and a second sub-resolution pattern from the first plurality of sub-resolution patterns;

modifying a size of the first sub-resolution pattern, wherein the second sub-resolution pattern remains same in size and position; and implement the plurality of target patterns on a semiconductor wafer.

13. The method of claim 12 further comprising:

after the size of the first sub-resolution pattern is modified, performing a mask rule check process on the first sub-resolution pattern and the second sub-resolution pattern.

14. The method of claim 13 further comprising further modifying the first sub-resolution pattern that has been modified, wherein the second sub-resolution pattern remains the same in size and position.

15. The method of claim 12, wherein the diffraction map comprises bright regions and dark regions, and the method further comprises generating the favorable zone comprising a part of the bright regions, and generating the unfavorable zone comprising a part of the dark regions.

16. The method of claim 15, wherein the selecting the first sub-resolution pattern and the second sub-resolution pattern is determined based on whether the first sub-resolution pattern and the second sub-resolution pattern extend into the unfavorable zones.

17. The method of claim 16 further comprising determining a first threshold brightness value and a second threshold brightness value, wherein regions in the diffraction map with brightness values lower than the first threshold brightness value are in the unfavorable zones, and wherein regions in the diffraction map with brightness values higher than the second threshold brightness value are in the favorable zones.

18. A method comprising:

generating a diffraction map from a target pattern;

generating a first scattering pattern and a second scattering pattern, wherein the first scattering pattern and the second scattering pattern are in the diffraction map, and wherein the second scattering pattern has a position and a size;

performing a first modification process, wherein the first scattering pattern is modified to generate a modified scattering pattern;

after the first modification process, performing a second modification process to further modify the modified scattering pattern and to generate a re-modified pattern, wherein at a time after the second modification process, the second scattering pattern remains same as the second scattering pattern that has the position and the size;

forming a photo lithography mask comprising the second scattering pattern and the re-modified first scattering pattern; and using the photo lithography mask to perform a light-exposure process on a photo resist.

19. The method of claim 18 further comprising determining an unfavorable zone and a favorable zone from the diffraction map, wherein the first scattering pattern extends into the unfavorable zone, and the second scattering pattern is outside of the unfavorable zone.

20. The method of claim 18, wherein each of the first modification process and the second modification process comprises a resizing operation.

* * * * *